(12) United States Patent
Hui et al.

(10) Patent No.: US 10,734,979 B1
(45) Date of Patent: Aug. 4, 2020

(54) ANALOG-TO-DIGITAL INVERTER CIRCUIT STRUCTURE WITH FDSOI TRANSISTORS

(71) Applicant: GLOBALFOUNDRIES INC., Grand Cayman (KY)

(72) Inventors: Xuemei Hui, Shanghai (CN); Don R. Blackwell, Santa Clara, CA (US)

(73) Assignee: GLOBALFOUNDRIES INC., Grand Cayman (KY)

( * ) Notice: Subject to any disclaimer, the term of this patent is extended or adjusted under 35 U.S.C. 154(b) by 0 days.

(21) Appl. No.: 16/502,163

(22) Filed: Jul. 3, 2019

(51) Int. Cl.
  *H03K 3/3565* (2006.01)
  *H01L 29/786* (2006.01)
  *H01L 27/12* (2006.01)

(52) U.S. Cl.
  CPC ....... *H03K 3/3565* (2013.01); *H01L 27/1203* (2013.01); *H01L 29/78648* (2013.01)

(58) Field of Classification Search
  CPC ....... H03K 3/353; H03K 3/356; H03K 3/3565
  See application file for complete search history.

(56) References Cited

U.S. PATENT DOCUMENTS

| 9,306,550 | B2 * | 4/2016 | Kumar | ................ H03K 3/3565 |
| 10,505,545 | B1 * | 12/2019 | Block | ................ H03K 19/0948 |
| 2006/0189049 | A1 | 8/2006 | Afentakis et al. | |
| 2015/0263707 | A1 | 9/2015 | Kumar | |

* cited by examiner

*Primary Examiner* — Hai L Nguyen
(74) *Attorney, Agent, or Firm* — David Cain; Hoffman Warnick LLC (57) ABSTRACT

Embodiments of the present disclosure provide a circuit structure including four FDSOI transistors coupled to a single output node at their respective back-gate terminals. An input voltage line may be coupled to the gate terminal of two transistors. The two transistors each may be coupled to the gate terminal of two other transistors at one of their source or drain terminals via a junction node. The other two transistors may be coupled to the single output node through one of their source or drain terminals. The other source or drain terminal of each transistor may be electrically coupled to a source voltage line or a drain voltage line.

20 Claims, 6 Drawing Sheets

ANALOG-TO-DIGITAL INVERTER CIRCUIT STRUCTURE WITH FDSOI TRANSISTORS

TECHNICAL FIELD

Embodiments of the disclosure relate generally to circuit structures, and more particularly, to circuit structures for converting an analog input to a digital output via FDSOI transistors. The various embodiments described herein can be used in a variety of applications, e.g., digital signal processing hardware.

BACKGROUND

In electrical hardware, a transistor is a critical component for implementing digital and analog circuitry designs. Generally, a transistor includes three electrical terminals: a source, a drain, and a gate. By applying different voltages to the gate terminal, the flow of electric current between the source terminal and the drain terminal of the transistor can be controlled. In digital circuits, the presence or absence of an applied voltage at the gate terminal of a transistor can be identified as "on" and "off" states of the transistor. Thus, transistors can serve as a switching element in various circuit designs, e.g., by manipulating a voltage applied to the gate of each transistor and thereby affecting the flow of electrical current between source and drain terminals of each transistor. These attributes cause a transistor to be a fundamental component in signal processing circuitry, e.g., RF amplifiers, oscillators, filters, etc.

When implemented into a circuit, transistors may allow a circuit structure to perform a variety of functions including, e.g., power amplification, conversion between analog and digital signals, voltage inversion, etc. As device size and scale continue to shrink, the total number of transistors used to implement these various functions, and the device space occupied by the various transistors, has become increasingly important to the design and reliability of a product. In conventional solutions, an analog input signal may be converted to a digital output signal via a configuration of eight or more interconnected transistors. Such configurations of transistors, however, do not account for recent changes in transistor hardware and corresponding improvements to the behavior of a transistor in a device.

SUMMARY

A first aspect of the present disclosure provides a circuit structure including: a first fully-depleted semiconductor-on-insulator (FDSOI) transistor having a gate terminal coupled to an input voltage line, a source terminal coupled to a source voltage line, a drain terminal coupled to a junction node, and a back-gate terminal coupled to an output voltage line at an output node; a second FDSOI transistor having a gate terminal coupled to the input voltage line, a drain terminal coupled to the drain terminal of the first FDSOI transistor at the junction node, a source terminal coupled to a drain voltage line, and a back-gate terminal coupled to the output voltage line at the output node; a third FDSOI transistor having a gate terminal coupled to the first and second FDSOI transistors at the junction node, a source terminal coupled to the source voltage line, a drain terminal coupled to the output voltage line at the output node, and a back-gate terminal coupled to the output voltage line at the output node; and a fourth FDSOI transistor having a gate terminal coupled to the first and second FDSOI transistors at the junction node, a drain terminal coupled to the output voltage line at the output node, a source terminal coupled to the drain voltage line, and a back-gate terminal coupled to the output voltage line at the output node, wherein the circuit structure converts an analog signal at the input voltage line to a non-inverted digital output signal at the output voltage line.

A second aspect of the present disclosure provides a circuit structure including: a first fully-depleted semiconductor-on-insulator (FDSOI) transistor having a gate terminal coupled to an input voltage line, a source terminal coupled to a source voltage line, a drain terminal coupled to a junction node, and a back-gate terminal coupled to an output voltage line at an output node; a second FDSOI transistor having a gate terminal coupled to the input voltage line, a drain terminal coupled to the drain terminal of the first FDSOI transistor at the junction node, a source terminal coupled to a drain voltage line, and a back-gate terminal coupled to the output voltage line at the output node; a third FDSOI transistor having a gate terminal coupled to the first and second FDSOI transistors at the junction node, a source terminal coupled to the source voltage line, a drain terminal coupled to the output voltage line at the output node, and a back-gate terminal coupled to the output voltage line at the output node; a fourth FDSOI transistor having a gate terminal coupled to the first and second FDSOI transistors at the junction node, a drain terminal coupled to the output voltage line at the output node, a source terminal coupled to the drain voltage line, and a back-gate terminal coupled to the output voltage line at the output node; a fifth FDSOI transistor having a gate terminal coupled to the output voltage line at the output node, a drain terminal coupled to the first, second, third, and fourth FDSOI transistors at the junction node, a source terminal coupled to the drain voltage line, and a back-gate terminal coupled to the output voltage line at the output node, wherein the circuit structure converts an analog signal at the input voltage line to a non-inverted digital output signal at the output voltage line.

A third aspect of the present disclosure provides a circuit structure including: a doped semiconductor well on an upper surface of a semiconductor substrate; a buried insulator layer on the doped semiconductor well; a plurality of fully-depleted semiconductor-on-insulator (FDSOI) transistors formed on the buried insulator layer above the doped semiconductor well, and separated by a plurality of shallow trench isolation (STI) regions on the doped semiconductor well, such that the doped semiconductor well defines a shared back-gate terminal of each of the plurality of FDSOI transistors, wherein the plurality of FDSOI transistors includes: a first fully-depleted semiconductor-on-insulator (FDSOI) transistor having a gate terminal coupled to an input voltage line, a source terminal coupled to a source voltage line, a drain terminal coupled to a junction node, a second FDSOI transistor having a gate terminal coupled to the input voltage line, a drain terminal coupled to the drain terminal of the first FDSOI transistor at the junction node, a source terminal coupled to a drain voltage line, a third FDSOI transistor having a gate terminal coupled to the first and second FDSOI transistors at the junction node, a source terminal coupled to the source voltage line, a drain terminal coupled to an output voltage line at an output node, and a fourth FDSOI transistor having a gate terminal coupled to the first and second FDSOI transistors at the junction node, a drain terminal coupled to the output voltage line at the output node, a source terminal coupled to the drain voltage line; and an output contact to a first end of the doped semiconductor well and electrically coupled to the output node, such that the output contact couples the shared back-gate terminal of each of the plurality of FDSOI transistors to the output node, wherein the circuit structure converts an analog signal at the input voltage line to a non-inverted digital output signal at the output voltage line.

BRIEF DESCRIPTION OF THE DRAWINGS

These and other features of this disclosure will be more readily understood from the following detailed description of the various aspects of the disclosure taken in conjunction with the accompanying drawings that depict various embodiments of the disclosure, in which.

It is noted that the drawings of the disclosure are not necessarily to scale. The drawings are intended to depict only typical aspects of the disclosure, and therefore should not be considered as limiting the scope of the disclosure. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Embodiments of the disclosure provide a circuit structure for converting an analog input signal to a non-inverted digital output signal while retaining information embedded within the analog input signal. A "Schmitt Trigger" is a conventional circuit structure capable of converting an analog input signal to a digital output signal. During operation, a Schmitt Trigger will compare an input analog voltage to two different thresholds, and switch its output signal between a high or low digital voltage based on whether the input analog voltage exceeds either of the two threshold voltages. Existing Schmitt Trigger configurations typically require at least six transistors and more commonly require the presence of eight or more transistors. The high number of transistors requires a significant amount of surface area on a device to implement the desired functionality. Additionally, conventional Schmitt Trigger circuits have variously failed to account for technical advantages of non-conventional transistor hardware, e.g., fully depleted semiconductor-on-insulator (FDSOI) transistors.

Embodiments of the present disclosure provide a circuit structure for converting an analog input signal from an input voltage line to digital output signal with as few as four FDSOI transistors, or in some cases up to five FDSOI transistors. Embodiments of the circuit structure described herein offer this advantage, e.g., by coupling the back-gate terminal of each transistor to a single output node. The coupling of each back-gate terminal to one output node may allow the entire circuit structure to be formed in only one doped semiconductor region, such as a P-well or N-well located beneath a buried insulator layer. Experimental implementation has demonstrated that the inverting transistors of a Schmitt Trigger are sensitive to changes in back-gate voltage. Conventional Schmitt Trigger circuits do not recognize this operational characteristic, and thus rely on additional transistors for signal control.

Figure 1:
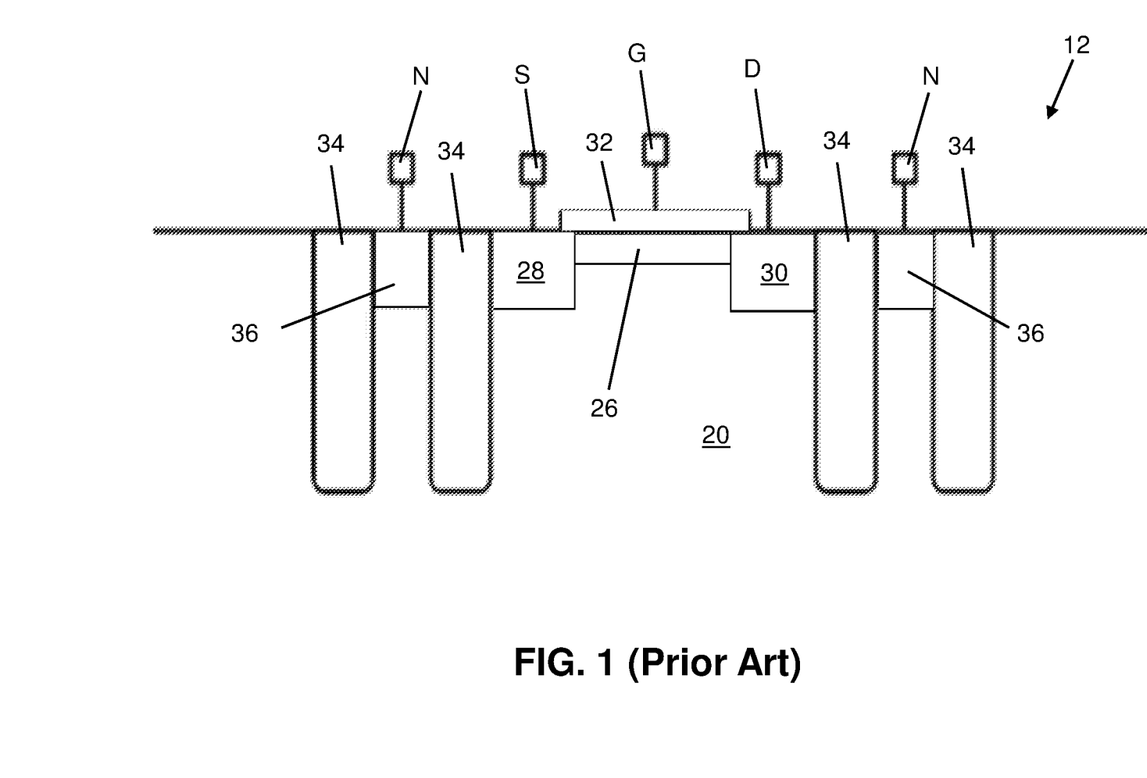
FIG. 1 shows a cross-sectional view of a conventional transistor structure.

Referring to FIG. 1, a conventional transistor 12 is depicted as an example to emphasize structural and operational differences relative to embodiments of the present disclosure, and transistor elements included therein. Conventional transistor 12 may be fabricated, e.g., by way of conventional fabrication techniques which may operate on a bulk silicon substrate. Conventional transistor 12 thus may be formed in a substrate 20 including, e.g., one or more semiconductor materials. Substrate 20 can include any currently known or later-developed semiconductor material, which may include without limitation, silicon, germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). The entirety of substrate 20 or a portion thereof may be strained.

Source and drain nodes S, D of conventional transistor 12 may be coupled to regions of substrate 20 which include conductive dopants therein, e.g., a source region 28 and a drain region 30 separated by a channel region 26. A gate region 32 formed on channel region 26 can be coupled to a gate node G to control the formation of a conductive channel within channel region 26. A group of trench isolations 34 may be formed from electrically insulating materials such that regions 26, 28, 30 are laterally separated from parts of other transistors. As shown, trench isolations 34 form an insulating barrier between terminals 36 and regions 26, 28, 30 and/or other elements. Further features of each element in conventional transistor 12 (e.g., function and material composition) are described in detail elsewhere herein relative to similar components in an FDSOI transistor 102 (FIG. 2).

Figure 2:
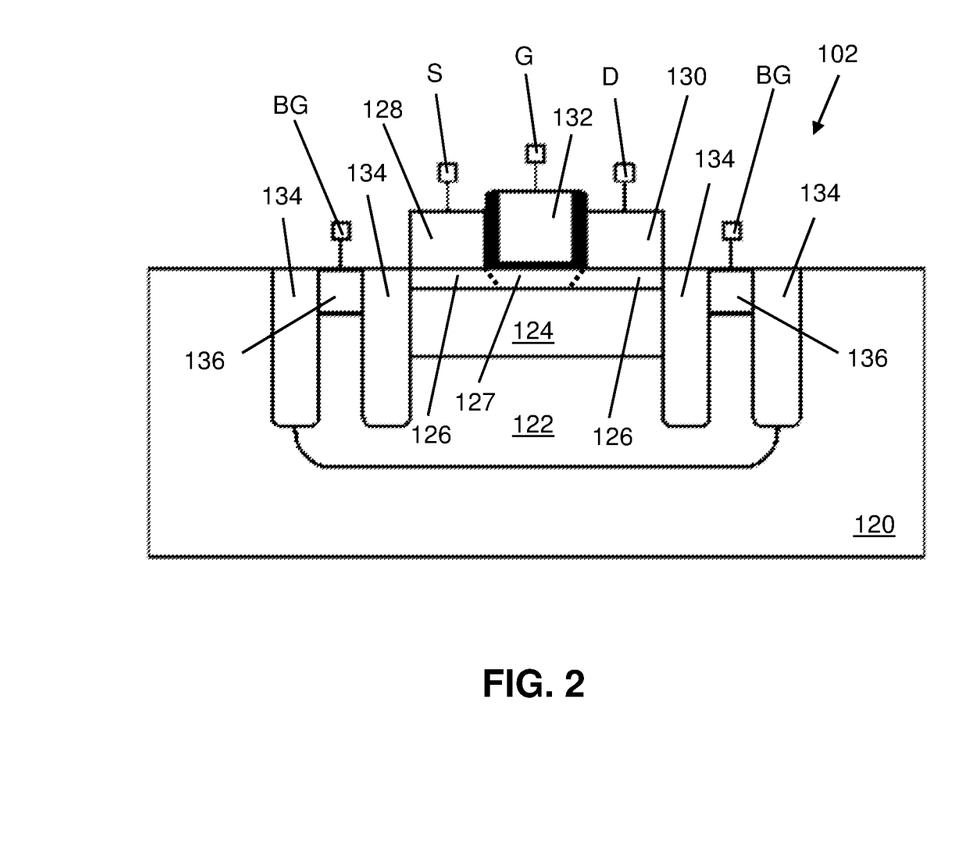
FIG. 2 shows a cross-sectional view of a fully depleted semiconductor-on-insulator (FDSOI) transistor structure with a back-gate region beneath a buried insulator layer according to embodiments of the disclosure.

Turning to FIG. 2, a cross-sectional view of an FDSOI transistor 102, which may be deployed, e.g., in structures and methods according to the disclosure, is shown. FDSOI transistor 102 can be formed with structural features for reducing the electrical resistance across source and drain terminals S, D thereof. FDSOI transistor 102 and components thereof can be formed on and within a substrate 120. Substrate 120 can include any currently known or later-developed semiconductor material including, without limitation, one or more of the example semiconductor materials described elsewhere herein relative to substrate 20 (FIG. 1). A back-gate region 122, alternatively identified as an n-type or p-typed doped well region, of substrate 120 can be implanted with one or more doping compounds to change the electrical properties thereof. Doping generally refers to a process by which foreign materials ("dopants") are added to a semiconductor structure to alter its electrical properties, e.g., resistivity and/or conductivity. Where a particular type of doping (e.g., p-type or n-type) doping is discussed herein, it is understood that an opposite doping type may be implemented in alternative embodiments. Implantation refers to a process in which ions are accelerated toward a solid surface to penetrate the solid up to a predetermined range based on the energy of the implanted ions. Thus, back-gate region 122 can include the same material composition as the remainder of substrate 120, but can additionally include dopant materials therein. A buried insulator layer 124, also known in the art as a "buried oxide" or "BOX" layer, can separate back-gate region 122 of substrate 120 from source/drain regions 126 and a channel region 127 of FDSOI transistor 102. Buried insulator layer 124 therefore may be composed of one or more oxide compounds, and/or any other currently known or later-developed electrically insulative substances. FDSOI transistor 102 therefore can be embodied as a "fully-depleted semiconductor on insulator" (FDSOI) structure, distinguishable from other structures (e.g., conventional transistor 12 (FIG. 1)) by including buried insulator layer 124, back-gate nodes BG, etc., thereby allowing technical advantages such as an adjustable electric potential within back-gate region 122 of FDSOI transistor 102 as discussed elsewhere herein.

Source/drain regions 126 and channel region 127 may electrically couple a source terminal 128 of FDSOI transistor 102 to a drain terminal 130 of FDSOI transistor 102 when transistor is in on state. A gate stack 132 can be positioned over channel region 127, such that a voltage of gate node G controls the electrical conductivity between source and drain terminals 128, 130 through source/drain regions 126 and channel region 127. Gate stack 132 can have, e.g., one or more electrically conductive metals therein, in addition to a gate dielectric material (indicated with black shading between bottom of stack and channel region 127) for separating the conductive metal(s) of gate stack 132 from at least channel region 127. A group of trench isolations 134, in addition, can electrically and physically separate the various regions of FDSOI transistor 102 from parts of other transistors. Trench isolations 134 may be composed of any insulating material such as $SiO_2$ or a "high-k" dielectric having a high dielectric constant, which may be, for example, above 3.9. In some situations, trench isolations 134 may be composed of an oxide substance. Materials appropriate for the composition of trench isolations 134 may include, for example, silicon dioxide ($SiO_2$), hafnium oxide ($HfO_2$), alumina ($Al_2O_3$), yttrium oxide ($Y_2O_3$), tantalum oxide ($Ta_2O_5$), titanium dioxide ($TiO_2$), praseodymium oxide ($Pr_2O_3$), zirconium oxide ($ZrO_2$), erbium oxide ($ErO_x$), and other currently known or later-developed materials having similar properties.

Back-gate region 122 can be electrically coupled to back-gate node BG through back-gate terminals 136 within substrate 120 to further influence the characteristics of FDSOI transistor 102, e.g., the conductivity between source and drain terminals 128, 130 through source/drain regions 126 and channel region 127. Applying an electrical potential to back-gate terminals 136 at back-gate node BG can induce an electric charge within back-gate region 122, thereby creating a difference in electrical potential between back-gate region 122 and source/drain regions 126, channel region 127, across buried insulator layer 124. Among other effects, this difference in electrical potential between back-gate region 122 and source/drain regions 126, channel region 127, of substrate 120 can affect the threshold voltage of FDSOI transistor 102, i.e., the minimum voltage for inducing electrical conductivity across source/drain and channel regions 126, 127 between source and drain terminals 128, 130, as discussed herein. In particular, applying a back-gate biasing voltage to back-gate terminals 136 can lower the threshold voltage of FDSOI transistor 102, thereby reducing source drain resistance and increasing drain current, relative to the threshold voltage of FDSOI transistor 102 when an opposite voltage bias is applied to back-gate terminals 136. This ability of FDSOI transistor 102, among other things, can allow a reduced width (saving silicon area) relative to conventional applications and transistor structures. In an example embodiment, a width of source/drain and channel regions 126, 127 (i.e., into and out of the plane of the page) can be between approximately 0.3 micrometers (μm) and approximately 2.4 μm. A length of source/drain and channel regions 126, 127 (i.e., left to right within the plane of the page) between source and drain terminals 128, 130 can be, e.g., approximately twenty nanometers (nm). FDSOI technology transistors, e.g., FDSOI transistor 102, offer the ability to apply a voltage bias to back-gate region 122 to manipulate the threshold voltage $V_t$ (i.e., minimum voltage for channel formation) of FDSOI transistor 102. As described herein, back-gate region 122 can allow a user to manipulate the threshold voltage of gate stack 132 to control the channel formation within channel region 127. Back-gate region 122 can thus be cross-coupled to other portions of a circuit structure, e.g., to affect the profile of output signals. As discussed herein, variation between operational sensitivity and non-sensitivity to back-gate voltage in different transistors of a Schmitt Trigger configuration permits multiple FDSOI transistors to be coupled in parallel to an output voltage, and/or formed in a single doped semiconductor well. Embodiments of the disclosure thus may reduce the total surface area and/or number of transistors in a analog-to-digital converter such as a Schmitt Trigger.

Figure 3:
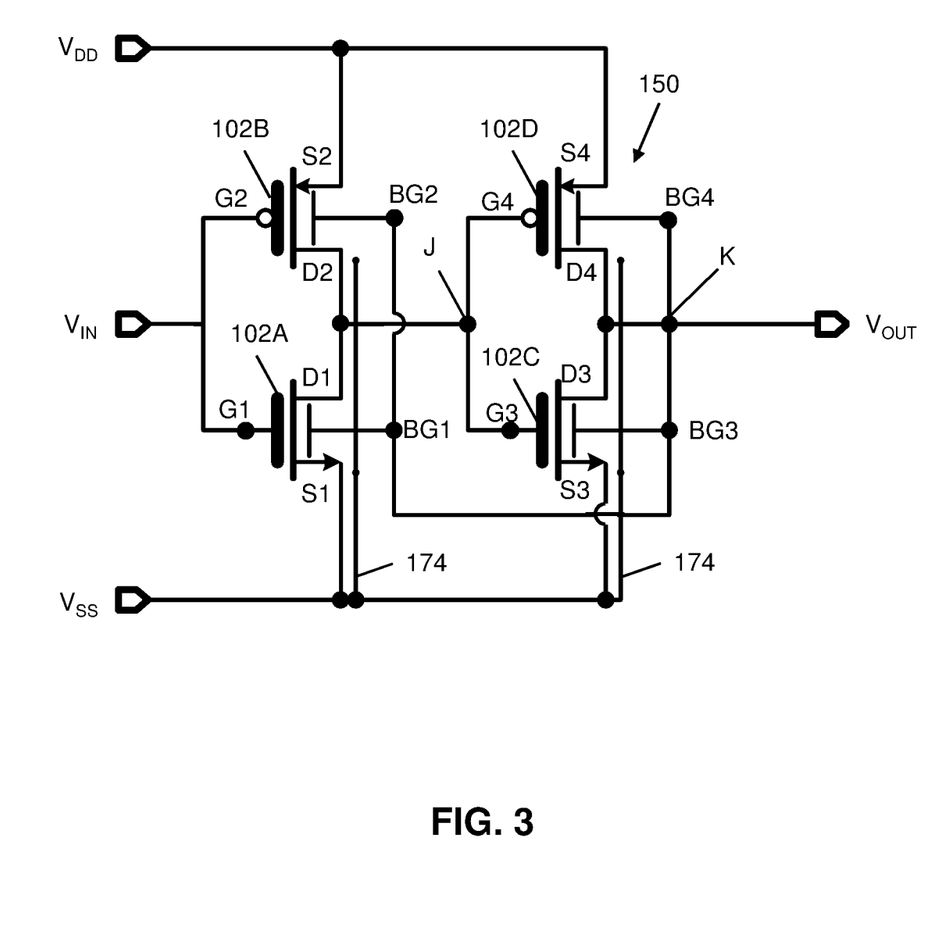
FIG. 3 shows a schematic view of a circuit structure according to embodiments of the disclosure.

Turning to FIG. 3, a schematic view of a circuit structure 150 according to embodiments of the disclosure is shown. Circuit structure 150 may include an electrical coupling an input line ("$V_{IN}$") and an electrical coupling to an output line ("$V_{OUT}$"), as well as voltage taps to a source voltage line ("$V_{SS}$") and a drain voltage line ("$V_{DD}$"). Circuit structure 150 may include a set of four FDSOI transistors 102, separately labeled 102A, 102B, 102C, 102D (collectively, "FDSOI transistors 102"). Two FDSOI transistors 102A, 102B may define an input or "trigger" stage of circuit structure 150 for receiving signals from the input voltage line, while two other FDSOI transistors 102C, 102D may define an output stage of circuit structure 150 for transmitting output signals to the output voltage line. The "trigger" stage is operationally responsible for evaluating whether the input voltage of input voltage line $V_{IN}$ exceeds upper or lower voltage thresholds indicative of low or high output voltages, and thus triggers changes in the produced output signal. Each FDSOI transistor 102A, 102B, 102C, 102D may have respective source, drain, gate, and back-gate terminals (S1, D1, G1, BG1, etc.) for interconnection with other elements of circuit structure 150.

As shown, first FDSOI transistor 102A may have a gate terminal G1 coupled to input voltage line $V_{IN}$, and a source terminal S1 electrically coupled to source voltage line $V_{SS}$. The drain terminal of first FDSOI transistor 102A, however, maybe electrically coupled to a junction node J which defines an electrical connection to source terminal S2 of second FDSOI transistor 102B, and the gate terminals G3, G4 of third and fourth FDSOI transistors 102. As shown, back-gate terminal BG1 of first FDSOI transistor 102A may be coupled to output voltage line $V_{OUT}$ at an output node K. Similar to first FDSOI transistor 102B, second FDSOI transistor 102B may include a gate terminal G2 coupled to input voltage line $V_{IN}$, a source terminal S2 coupled to drain voltage line $V_{DD}$, a drain terminal D2 coupled to junction node J, and a back-gate terminal BG2 coupled to output voltage line $V_{OUT}$ at output node K. First and second FDSOI transistors 102A, 102B thus define an input stage of circuit structure 150. FDSOI transistors 102A, 102B, along with the voltages of source voltage line $V_{SS}$ and drain voltage line $V_{DD}$, among other things may define the define the "hysteresis voltage" of circuit structure 150. As will be discussed in further detail elsewhere herein, the hysteresis voltage of circuit structure 150 is calculated as the voltage difference between upper and lower voltage thresholds for switching the digital output of circuit structure 150 between its high voltage and low voltage levels.

Third and fourth FDSOI transistors 102C, 102D together may define an output stage of circuit structure 150. Third FDSOI transistor 102C may include a gate terminal G3 coupled to junction node J, and a source terminal S3 coupled to source voltage line $V_{SS}$ in parallel with first FDSOI transistor 102A. A drain terminal D3 of third FDSOI transistor 102C may be coupled to output node K, and a back-gate terminal BG3 may be coupled to output node K in parallel with drain terminal D3. Fourth FDSOI transistor 102D may have electrical coupling similar to third FDSOI transistor 102C, e.g., gate terminal G4 coupled to junction node J, a source terminal S4 coupled to drain voltage line $V_{DD}$ in parallel with second FDSOI transistor 102B, in addition to a drain terminal D4 and a back-gate terminal BG4 coupled to output node K in parallel with each other. Third and fourth FDSOI transistors 102C, 102D act in tandem with first and second FDSOI transistors 102A, 102B as a digital switch. The analog input voltage being applied to the gate terminals of FDSOI transistors 102A, 102B will affect the passage of current between their source and drain terminals, thereby affecting the passage of current through FDSOI transistors 102C, 102D. FDSOI transistors 102C, 102D will thereby generate a digital output voltage at output voltage line $V_{OUT}$ which corresponds to, and inverts, the signal characteristics received in first and second FDSOI transistors 102A, 102B of circuit structure 150 such that the final output (Vout) is a non-inverting digital representation of the input signal (Vin).

It is emphasized that the use of FDSOI transistors 102A, 102B, 102C, 102D with back-gate voltage terminals BG1, BG2, BG3, BG4 allows circuit structure 150 to serve as a Schmitt Trigger with only four FDSOI transistors 102, and while occupying a low amount of space on a device. Additionally, experimental data has demonstrated a low back-gate voltage sensitivity in FDSOI transistors 102C, 102D of the output stage, and a heightened sensitivity to back-gate voltage in FDSOI transistors 102A, 102B of the input stage. Thus, it is possible to connect all back-gate terminals BG1, BG2, BG3, BG4 to output node K in parallel without negatively affecting FDSOI transistors 102C, 102D. In conventional settings, FDSOI transistors 102C, 102D are designed for placement on a different doped semiconductor region from FDSOI transistors 102A, 102B, but circuit structure 150 avoids this limitation. As discussed in further detail elsewhere herein, circuit structure 150 optionally may include a set of source contacts 174 for electrically coupling source voltage line $V_{SS}$ to a shared doped semiconductor well at a location opposite that of output node K.

As discussed elsewhere herein, each FDSOI transistor 102 may be formed at least partially within a single doped semiconductor well to eliminate the need for intermediate transistors and/or alternately doped wells in portions of a device where circuit 150 exists. Thus, each FDSOI transistor 102A, 102B 102C, 102D optionally may be of a same doping type (i.e., P-type transistor or N-type transistor) without doping variations between individual FDSOI transistors 102 of circuit structure 150. According to an example, circuit structure 150 as shown in FIG. 3 may occupy a cross-sectional area of at most approximately 6.0 square micrometers ($\mu m^2$) of a device. More specifically, the components of circuit structure 150 shown in FIG. 3 may be formed over a device width of at most between approximately two and three $\mu m$, and a length of at most between approximately two and three $\mu m$. Such dimensions of circuit structure 150 may be achievable, e.g., by forming each FDSOI transistor 102 in a single doped semiconductor well, and/or by coupling each back-gate terminal of FDSOI transistors 102 in parallel to output node K. In any case, various circuit configurations according to the disclosure reduce the number and size of fundamental components in circuit structure 150.

Figure 4:
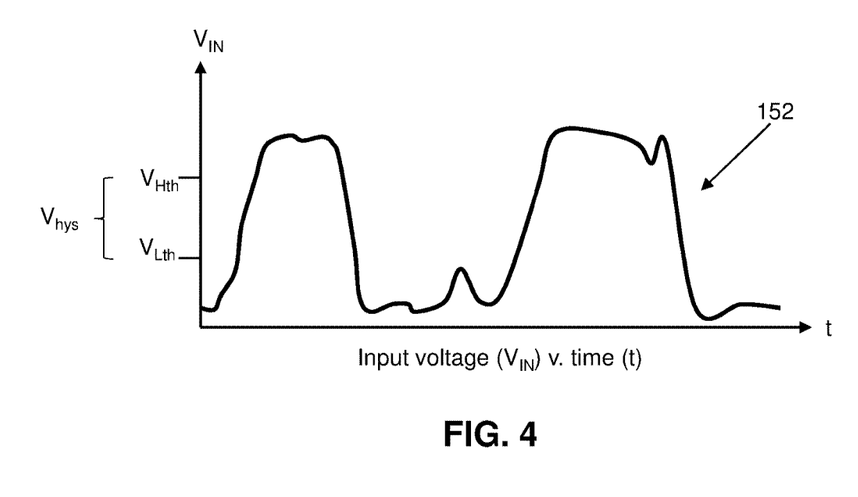
FIG. 4 shows an example plot of an analog input signal transmitted to a circuit structure according to embodiments of the disclosure.
Figure 5:
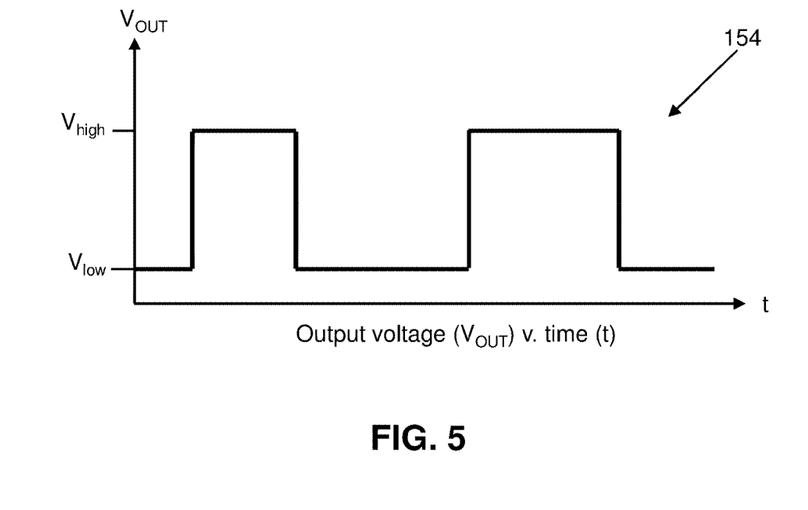
FIG. 5 shows an example plot of a digital output signal transmitted from a circuit structure according to embodiments of the disclosure.

Referring to FIGS. 3-5 together, circuit structure 150 according to embodiments of the disclosure is configured to convert an analog input signal of input voltage line $V_{IN}$ to a digital output signal at output voltage line $V_{OUT}$. The input voltage profile of circuit structure 150 is depicted with input profile 152 in FIG. 4. The output voltage profile from circuit structure 150 is depicted with output profile 154 in FIG. 5. Circuit structure 150 is configured to output a digital voltage that is proportionate to the analog input voltage, i.e., generate a high voltage in response to a high voltage and vice versa. Additionally, the configuration of FDSOI transistors 102 in circuit structure 150, and the voltage levels applied thereto through source voltage line $V_{SS}$ and drain voltage line $V_{DD}$ will define a pair of threshold voltage levels for distinguishing whether to emit a high or low output voltage. The high threshold voltage is labeled as $V_{Hth}$ in and the low threshold voltage is labeled $V_{LTh}$ in FIG. 4. The two threshold voltages $V_{Hth}$, $V_{LTh}$ shown in FIG. 4 do not represent absolute thresholds for emitting high or low voltages, but instead represent "triggered thresholds" which only change the output digital voltage when the present voltage is at an opposite level. For example, when output voltage is already at its high level ($V_{high}$ of FIG. 5), no change in output will occur when the voltage of input voltage line $V_{IN}$ exceeds high threshold voltage $V_{Hth}$. By contrast, circuit 150 will switch the output voltage at output voltage line $V_{OUT}$ from its high level ($V_{high}$ of FIG. 5) to its low level ($V_{low}$ of FIG. 5) in response to the voltage of input voltage line $V_{IN}$ exceeding low threshold voltage $V_{L}$h. The threshold voltages $V_{Hth}$, $V_{L}$h of circuit structure 150 may depend on, e.g., the size of transistors included therein and electrical couplings between FDSOI transistors 102 and other components. In any case, the difference between threshold voltages $V_{Hth}$, $V_{Lth}$ may be defined as the hysteresis voltage $V_{hys}$ of circuit structure 150. By varying the voltage difference between thresholds $V_{Hth}$, $V_{Lth}$, hysteresis voltage $V_{hys}$ may be adjustable to affect the sensitivity of circuit structure 150 to different amounts of voltage swing.

Figure 6:
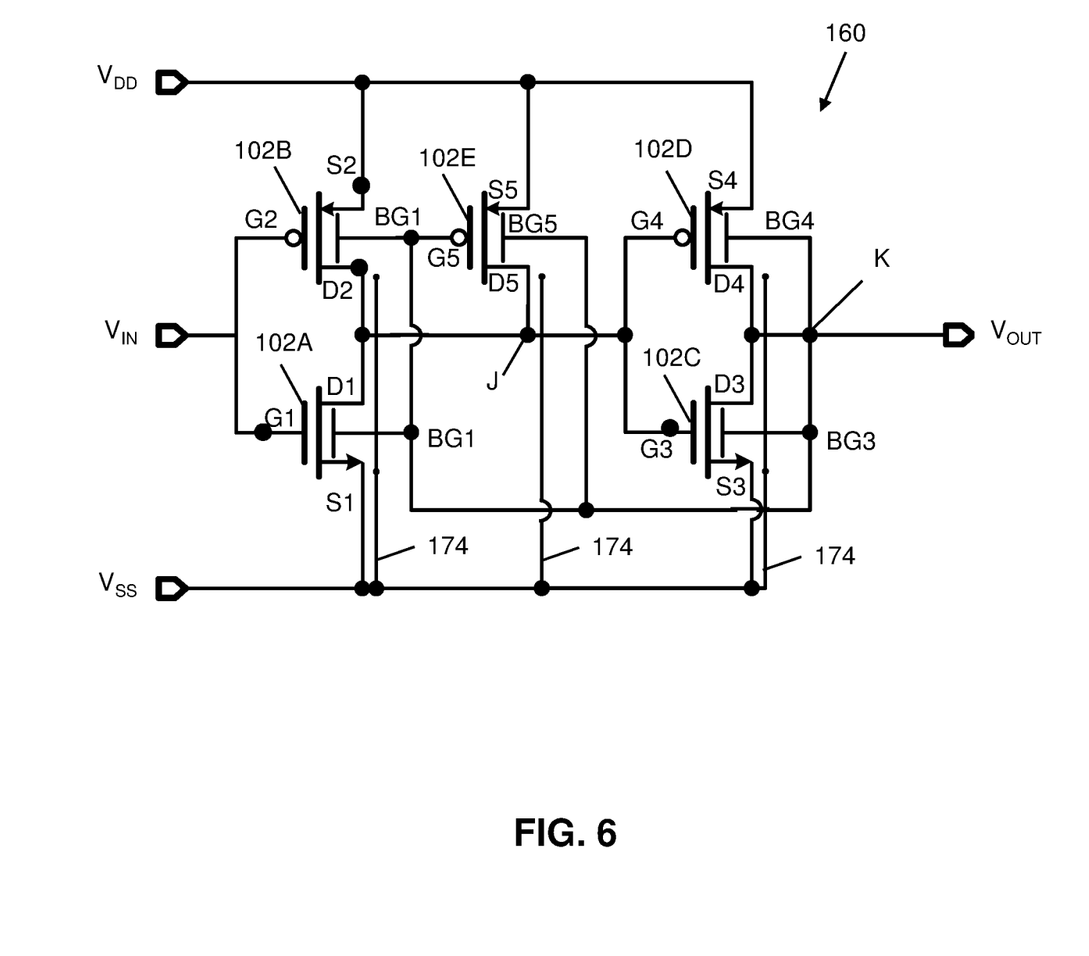
FIG. 6 shows a schematic view of a circuit structure according to further embodiments of the disclosure.

Referring now to FIG. 6, a circuit structure 160 with further capability to adjust hysteresis voltage $V_{hys}$ is shown according to further embodiments of the disclosure. Circuit structure 160 may include four FDSOI transistors 102A, 102B, 102C, 102D arranged and interconnected in substantially the same manner as embodiments of circuit structure 150 (FIG. 3) discussed elsewhere herein. Circuit structure 160 additionally may include a fifth FDSOI transistor 102E positioned between FDSOI transistors 102A, 102B and FDSOI transistors 102C, 102D for active control and/or adjustment of circuit structure 160 behavior during operation. As shown, fifth FDSOI transistor 102E may have a gate terminal G5 electrically coupled to output node K in parallel with back-gate terminals BG1, BG2, BG3, BG4, and thus set to the value of output voltage $V_{OUT}$. Fifth FDSOI transistor 102E also may include, e.g., a drain terminal D5 electrically coupled to junction node J and thus set to the same voltage as drain terminal D1, source terminal S2, and gate terminals G3, G4. Back-gate terminal BG5 of fifth FDSOI transistor 102E may be coupled to output node K in parallel with gate terminal G5 and back-gate terminals BG1, BG2, BG3, BG4. Source terminal S5 of fifth FDSOI transistor 102E may be coupled to drain voltage line $V_{DD}$, as shown.

The voltage coupling of fifth FDSOI transistor 102E may have little to no effect on the relationship between input voltage line $V_{IN}$ and output voltage line $V_{OUT}$, but nonetheless may be capable of adjusting the threshold voltage for producing high and low voltage outputs from circuit structure 160. In some implementations, the presence of only four FDSOI transistors 102 may limit an operator's ability to control hysteresis voltage $V_{hys}$ as compared to conventional circuit structures. For example, increasing the number of transistors and/or cross-couplings with other components may allow greater variability of hysteresis voltage $V_{hys}$, despite the greater number of components and occupied surface area. Fifth FDSOI transistor 102E may be provided in circuit structure 160, in some implementations, for added adjustability of the hysteresis voltage, e.g., based on the voltage of drain voltage line $V_{DD}$. By manipulating the size of each FDSOI transistor 102, particularly transistors 102A, 102B, and/or 102E, the hysteresis voltage of circuit structure 160 may be adjustable between approximately fifty millivolts (mV) to provide a narrow switching range, and approximately three-hundred mV to provide a wider switching range. In embodiments of circuit structure 160, fifth FDSOI transistor 102E need not be formed in the same doped semiconductor well as other FDSOI transistors 102A, 102B, 102C, 102D, and additionally may be of the same doping type or a different doping type. As discussed in further detail elsewhere herein, circuit structure 160 optionally may include a set of source contacts 174 for electrically coupling source voltage line $V_{SS}$ to a shared doped semiconductor well at a location opposite that of output node K.

Figure 7:
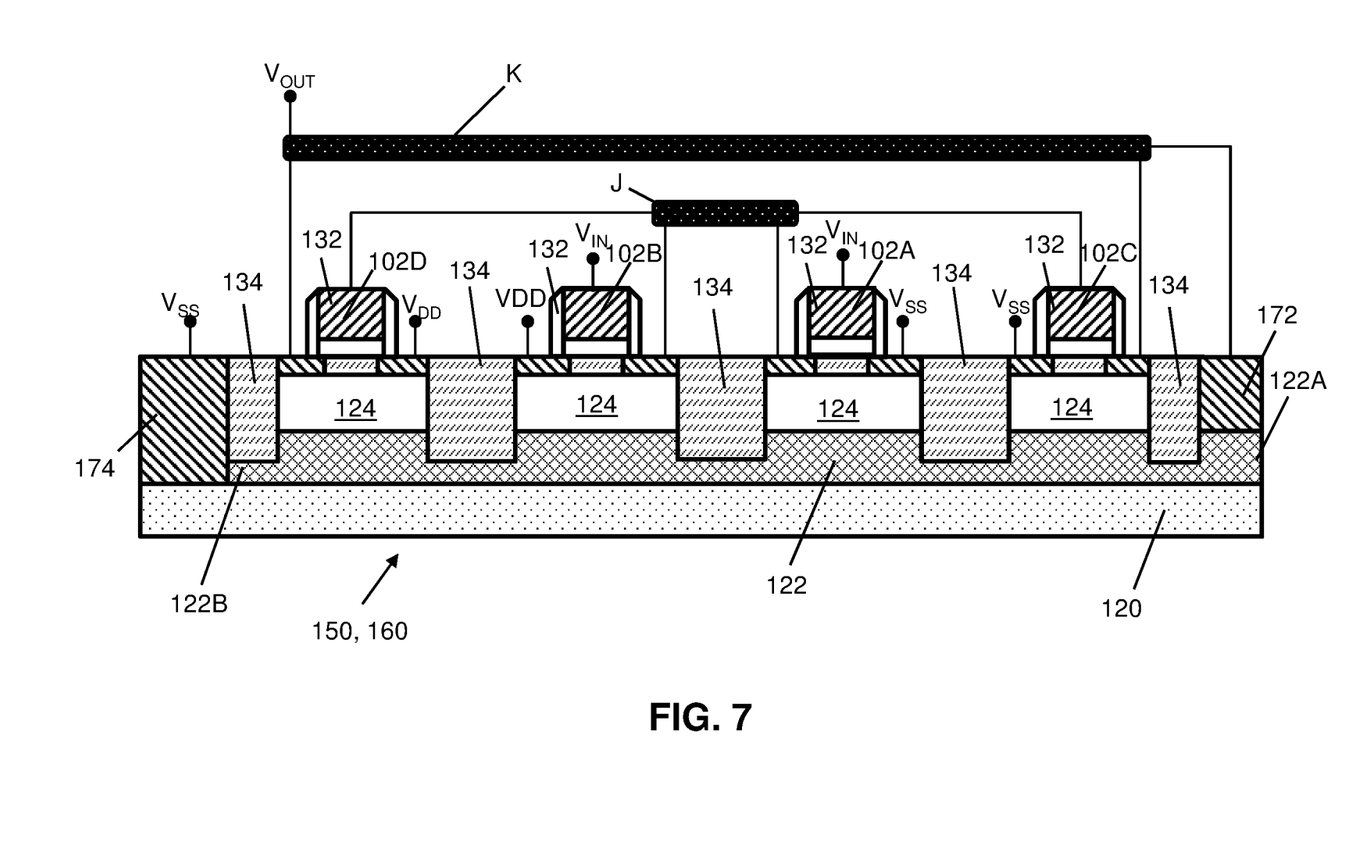
FIG. 7 shows a cross-sectional view of a circuit structure formed on one doped semiconductor well according to embodiments of the disclosure.

Referring now to FIG. 7, a cross-sectional view of circuit structure 150, alternatively a partial schematic view of circuit structure 160, is shown according to embodiments of the disclosure. In the case of circuit structure 160, fifth FDSOI transistor 102E is omitted solely for clarity, but may be coupled to junction node J, output node K, and drain voltage line $V_{DD}$ as described elsewhere herein. As discussed elsewhere herein, circuit structure(s) 150, 160 may include a substrate 120 with a doped semiconductor well 122 formed on an upper surface thereof. Doped semiconductor well 122 may be of a single predetermined doping type, e.g., P-type doped semiconductor or N-type doped semiconductor depending on the desired polarity of circuit structure(s) 150, 160. One or more buried insulator layers 124 may overlie doped semiconductor well 122, each of which may be horizontally separated by a plurality of isolation regions 134 as also described herein. Although a single doped semiconductor well 122 may be formed on substrate 120, the single doped semiconductor well 122 may form a portion of multiple FDSOI transistors 102. For the sake of example, four FDSOI transistors 102A, 102B, 102C, 102D are depicted in FIG. 7, but it is understood that more or fewer FDSOI transistors 102 may be formed in further embodiments.

Isolation regions 134, as shown, may horizontally separate a plurality of buried insulator layers 124 from each other, thereby defining the location of each FDSOI transistor 102A, 102B, 102C, 102D. Gate stacks 132 may be formed over source, drain, and channel regions above each buried insulator layer 124 to provide the functional components of each FDSOI transistor 102. Thus, the structure and placement of each FDSOI transistor 102 of circuit structure 150, 160 is a contrast to conventional converter and/or inverter configurations which require multiple doped semiconductor wells 122. Within this structural arrangement, each terminal of FDSOI transistor can be variously coupled to input voltage line $V_{IN}$, output voltage line $V_{OUT}$, source voltage line $V_{SS}$, drain voltage line $V_{DD}$, junction node J, output node K, and/or other FDSOI transistor 102 terminals according to the arrangement(s) shown in FIGS. 3 and 4. As also shown in FIG. 7, each isolation region 134 may extend at most partially into doped semiconductor well 122, such that the back-gate of each FDSOI transistor 102A, 102B, 102C, 102D remains coupled to output node K through doped semiconductor well 122.

In addition to the above-noted features, circuit structure(s) 150, 160 as shown in FIG. 7 may include additional structures for coupling between doped semiconductor well 122 and other components. For example, an output contact 172 may be formed to doped semiconductor well 122 at a location horizontally distal to FDSOI transistors 102. Output contact 172 may be formed of any currently known or later developed conductor suitable for electrically coupling two or more active components, and according to examples may include, copper (Cu), aluminum (Al), zinc (Zn), and/or various other metal wire materials. Output contact 172, in a particular example, may be formed to a first end of doped semiconductor well 122, such that output contact 172 defines an extremity of doped semiconductor well 122 and circuit structure(s) 150, 160. As shown, output contact 172 may be electrically coupled to output node K, and in still further examples, output contact 172 may be the physical structure which creates output node K by being coupled to source or drain terminals of FDSOI transistors 102C, 102D.

For additional electrical stability, doped semiconductor well 122 may further include a source contact 174 formed of a same or similar conductive material as output contact 172. Source contact 174 may electrically couple source voltage line $V_{SS}$ to doped semiconductor well 122B, e.g., to interconnect the selected source voltage to output node K. Isolation region(s) 134 may be positioned directly horizontally between source contact 174 and FDSOI transistor(s) 102 to prevent significant cross-talk and/or electrical interference with FDSOI transistor 102 operation. Each FDSOI transistor 102 thus may be further coupled to source voltage line $V_{SS}$ through source contact 174. However, the size of doped semiconductor well 122 between FDSOI transistor 102 back-gate terminals and source contact 174 may be chosen to provide a greater amount of resistance along the pathway to source voltage line $V_{SS}$, thereby reducing the chance of electrical shorting or erratic converter behavior during operation. In the example of circuit structure(s) 150, 160 shown in FIG. 7, the advantages of reduced surface area in a larger device structure (i.e., circuit structure(s) 150, 160 occupying at most approximately 6.0 μm) are retained at partially by, e.g., only one doped semiconductor well 122 shared between all FDSOI transistors 102. Additionally, circuit structure(s) 150, 160 as shown in FIG. 7 remain capable of converting an analog input signal at input voltage line $V_{IN}$ into a digital output signal at output voltage line $V_{OUT}$ solely by way of FDSOI transistors 102.

Embodiments of the disclosure are operable to provide several technical and commercial advantages, some of which are discussed by example herein. Although other conventional converter designs have made partial use of FDSOI transistors to implement various functions, the ability to use only four or five FDSOI transistors, and/or a shared doped semiconductor well, to implement the same capabilities is heretofore unrecognized. Additionally, embodiments of circuit structure(s) 150, 160 occupy a greatly reduced surface area as compared to conventional Schmitt Trigger structures, and further adjustability of hysteresis voltage $V_{hys}$ is thus possible by varying the size of one or more FDSOI transistors 102 in circuit structure(s) 150, 160. Embodiments of the disclosure have proven, in experimental data, to be at least as reliable as conventional inverter and/or converter circuits with a larger number of transistors, in defiance of conventional designs which rely on multiple doped semiconductor wells and/or additional connections between input voltage, output voltage, source voltage, and drain voltage nodes. Among other things, the advantages described herein are attributable to higher back-gate voltage sensitivity at FDSOI transistors 102A, 102B defining an input stage of circuit structure 150, 160 than at FDSOI transistors 102C, 102D defining an output stage of circuit structure 150, 160.

The descriptions of the various embodiments of the present disclosure have been presented for purposes of illustration, but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A circuit structure comprising:
   a first fully-depleted semiconductor-on-insulator (FDSOI) transistor having a gate terminal coupled to an input voltage line, a source terminal coupled to a source voltage line, a drain terminal coupled to a junction node, and a back-gate terminal coupled to an output voltage line at an output node;
   a second FDSOI transistor having a gate terminal coupled to the input voltage line, a drain terminal coupled to the drain terminal of the first FDSOI transistor at the junction node, a source terminal coupled to a drain voltage line, and a back-gate terminal coupled to the output voltage line at the output node;
   a third FDSOI transistor having a gate terminal coupled to the first and second FDSOI transistors at the junction node, a source terminal coupled to the source voltage line, a drain terminal coupled to the output voltage line at the output node, and a back-gate terminal coupled to the output voltage line at the output node; and
   a fourth FDSOI transistor having a gate terminal coupled to the first and second FDSOI transistors at the junction node, a drain terminal coupled to the output voltage line at the output node, a source terminal coupled to the drain voltage line, and a back-gate terminal coupled to the output voltage line at the output node,
   wherein the circuit structure converts an analog signal at the input voltage line to a digital output signal at the output voltage line.

2. The circuit structure of claim 1, wherein the back-gate terminal of each of the first, second, third, and fourth FDSOI transistors are within a shared doped semiconductor well.

3. The circuit structure of claim 2, wherein the output node is coupled to a first end of the shared doped semiconductor well, and wherein the source voltage line is coupled to an opposing end of the shared doped semiconductor well.

4. The circuit structure of claim 1, further comprising a fifth FDSOI transistor having a gate terminal coupled to the output voltage line at the output node, a drain terminal coupled to the first, second, third, and fourth FDSOI transistors at the junction node, a source terminal coupled to the drain voltage line, and a back-gate terminal coupled to the output voltage line at the output node.

5. The circuit structure of claim 4, wherein the first, second, third, and fourth FDSOI transistors define a Schmitt Trigger for converting the analog signal to the digital output signal, and wherein the fifth transistor is configured to adjust a hysteresis voltage of the Schmitt Trigger.

6. The circuit structure of claim 1, wherein the first, second, third, and fourth FDSOI transistors occupy a cross-sectional area of at most approximately 6.0 square micrometers ($\mu m^2$).

7. The circuit structure of claim 1, wherein each of the first, second, third, and fourth FDSOI transistors have a same doping type.

8. A circuit structure comprising:
   a first fully-depleted semiconductor-on-insulator (FDSOI) transistor having a gate terminal coupled to an input voltage line, a source terminal coupled to a source voltage line, a drain terminal coupled to a junction node, and a back-gate terminal coupled to an output voltage line at an output node;
   a second FDSOI transistor having a gate terminal coupled to the input voltage line, a drain terminal coupled to the drain terminal of the first FDSOI transistor at the junction node, a source terminal coupled to a drain voltage line, and a back-gate terminal coupled to the output voltage line at the output node;
   a third FDSOI transistor having a gate terminal coupled to the first and second FDSOI transistors at the junction node, a source terminal coupled to the source voltage line, a drain terminal coupled to the output voltage line at the output node, and a back-gate terminal coupled to the output voltage line at the output node;
   a fourth FDSOI transistor having a gate terminal coupled to the first and second FDSOI transistors at the junction node, a drain terminal coupled to the output voltage line at the output node, a source terminal coupled to the drain voltage line, and a back-gate terminal coupled to the output voltage line at the output node; and
   a fifth FDSOI transistor having a gate terminal coupled to the output voltage line at the output node, a drain terminal coupled to the first, second, third, and fourth FDSOI transistors at the junction node, a source terminal coupled to the drain voltage line, and a back-gate terminal coupled to the output voltage line at the output node,
   wherein the circuit structure converts an analog signal at the input voltage line to a digital output signal at the output voltage line.

9. The circuit structure of claim 8, wherein the first, second, third, and fourth FDSOI transistors define a Schmitt Trigger for converting the analog signal to the digital output signal, and wherein the fifth transistor is configured to adjust a hysteresis voltage of the Schmitt Trigger.

10. The circuit structure of claim 8, wherein the back-gate terminal of each of the first, second, third, and fourth FDSOI transistors are within a shared doped semiconductor well.

11. The circuit structure of claim 10, wherein the output node is coupled to a first end of the shared doped semiconductor well, and wherein the source voltage line is coupled to an opposing end of the shared doped semiconductor well.

12. The circuit structure of claim 8, wherein the first, second, third, and fourth FDSOI transistors occupy a cross-sectional area of at most approximately 6.0 square micrometers ($\mu m^2$).

13. The circuit structure of claim 8, wherein each of the first, second, third, fourth, and fifth FDSOI transistors have a same doping type.

14. A circuit structure comprising:
  a doped semiconductor well on an upper surface of a semiconductor substrate;
  a buried insulator layer on the doped semiconductor well;
  a plurality of fully-depleted semiconductor-on-insulator (FDSOI) transistors formed on the buried insulator layer above the doped semiconductor well, and separated by a plurality of shallow trench isolation (STI) regions on the doped semiconductor well, such that the doped semiconductor well defines a shared back-gate terminal of each of the plurality of FDSOI transistors, wherein the plurality of FDSOI transistors includes:
    a first fully-depleted semiconductor-on-insulator (FDSOI) transistor having a gate terminal coupled to an input voltage line, a source terminal coupled to a source voltage line, a drain terminal coupled to a junction node,
    a second FDSOI transistor having a gate terminal coupled to the input voltage line, a drain terminal coupled to the drain terminal of the first FDSOI transistor at the junction node, a source terminal coupled to a drain voltage line,
    a third FDSOI transistor having a gate terminal coupled to the first and second FDSOI transistors at the junction node, a source terminal coupled to the source voltage line, a drain terminal coupled to an output voltage line at an output node, and
    a fourth FDSOI transistor having a gate terminal coupled to the first and second FDSOI transistors at the junction node, a drain terminal coupled to the output voltage line at the output node, a source terminal coupled to the drain voltage line; and
  an output contact to a first end of the doped semiconductor well and electrically coupled to the output node, such that the output contact couples the shared back-gate terminal of each of the plurality of FDSOI transistors to the output node,
  wherein the circuit structure converts an analog signal at the input voltage line to a digital output signal at the output voltage line.

15. The circuit structure of claim 14, further comprising a source contact to a second end of the doped semiconductor well and electrically coupled to the source voltage line, such that the source contact couples the shared back-gate terminal of each of the plurality of FDSOI transistors to the source voltage line.

16. The circuit structure of claim 14, further comprising a fifth FDSOI transistor having a gate terminal coupled to the output voltage line at the output node, a drain terminal coupled to the first, second, third, and fourth FDSOI transistors at the junction node, a source terminal coupled to the drain voltage line, and a back-gate terminal coupled to the output voltage line at the output node.

17. The circuit structure of claim 16, wherein the first, second, third, and fourth FDSOI transistors define a Schmitt Trigger for converting the analog signal to the digital output signal, and wherein the fifth transistor is configured to adjust a hysteresis voltage of the Schmitt Trigger.

18. The circuit structure of claim 14, wherein the first, second, third, and fourth FDSOI transistors occupy a cross-sectional area of at most approximately 6.0 square micrometers ($\mu m^2$).

19. The circuit structure of claim 14, wherein one of the plurality of STIs is positioned directly horizontally between the output contact and one of the plurality of FDSOI transistors.

20. The circuit structure of claim 14, wherein each of the plurality of FDSOI transistors have a same doping type.

* * * * *